United States Patent [19]
Chu

[11] Patent Number: 5,857,127
[45] Date of Patent: Jan. 5, 1999

[54] APPARATUS FOR THE PHOTORESIST DEVELOPMENT PROCESS OF AN INTEGRATED CIRCUIT FABRICATION

[75] Inventor: Ron-Fu Chu, Taipei, Taiwan

[73] Assignee: Nan Ya Technology Corp., Taiwan

[21] Appl. No.: 932,622

[22] Filed: Sep. 17, 1997

[30] Foreign Application Priority Data

Jul. 19, 1997 [TW] Taiwan ................... 86110250

[51] Int. Cl.⁶ ................... G03D 5/00
[52] U.S. Cl. ............ 396/611; 396/604; 396/627; 118/52
[58] Field of Search ............ 396/604, 611, 396/627; 118/52, 56, 319, 320, 321, 323

[56] References Cited

U.S. PATENT DOCUMENTS

| | | | |
|---|---|---|---|
| 5,294,257 | 3/1994 | Kelly et al. | 118/52 |
| 5,415,691 | 5/1995 | Fujiyama et al. | 118/52 |
| 5,601,645 | 2/1997 | Nonomura et al. | 118/52 |

*Primary Examiner*—D. Rutledge
*Attorney, Agent, or Firm*—Michael D. Bednarek; Kilpatrick Stockton LLP

[57] ABSTRACT

An apparatus for use in the photoresist development process of an integrated circuit fabrication is provided to improve the uniformity of development. The apparatus includes: a holder which includes a vertical spindle and a chuck fixed on the top of the vertical spindle, for horizontally holding a semiconductor wafer; a liquid feeder disposed above the holder, for supplying a developer onto the semiconductor wafer; a cup-type housing disposed under the holder, wherein the bottom of the cup-type housing includes a valve for draining the developer and a hole for allowing the vertical spindle to penetrate through; and a hoisting instrument fixed on the bottom of the cup-type housing, so that when the cup-type housing is lifted, the edge of the semiconductor wafer tightly contacts the sidewall of the cup-type housing, thereby forming a dish-like container for containing the developer.

5 Claims, 2 Drawing Sheets

APPARATUS FOR THE PHOTORESIST DEVELOPMENT PROCESS OF AN INTEGRATED CIRCUIT FABRICATION

BACKGROUND OF THE INVENTION

1. Field of the Invention

This invention relates in general to semiconductor integrated circuit fabrication, and more particularly to a modified apparatus including a cup-type device for containing the developer, so as to improve the uniformity of the photoresist development process.

2. Description of Related Art

In today's semiconductor integrated circuit (IC) fabrication, designed mask patterns are transferred to the semiconductor substrate by a photolithography process. Since the precision of pattern transference determines the characteristics of the product device, the photolithography process is one of the most important steps of the entire process. Usually, a typical photolithography process includes the steps of photoresist coating, exposure, development, and photoresist removal. First, a photoresist is coated on a semiconductor substrate. An exposure step is applied using a photomask containing the desired circuit pattern to induce a photochemical reaction in an area of the photoresist not shielded by the photomask pattern. The exposed photoresist is then subjected to a development step. Depending upon the chemical nature of the photoresist material, the exposed areas may be rendered more soluble in some developing solvent than the unexposed areas, thereby producing a positive-tone image of the photomask. Conversely, the exposed areas may be rendered less soluble producing a negative-tone image of the photomask. The net effect of this process is to produce a three-dimensional relief image in the photoresist that is a replication of the distinction between the opaque and transparent areas on the photomask.

All of the parameters in performing the development step should be precisely controlled to prevent the unexposed areas of the photoresist from being attacked by the developer. The major factors effecting this process are known as follows: developing time, concentration and temperature of the developer. An appropriate developing time is chosen in coordination with other process parameters. Basically, the developing time should be long enough to completely dissolve the photoresist. However, the development step cannot be carried out too long since it results in a worse line width tolerance in the photoresist pattern.

The developer concentration has a significant influence on the development step. As the concentration of the developer is increased, the developing time is reduced; thereby the throughput of IC fabrication is improved. However, too short a developing time will degrade the resolution on the resultant photoresist pattern. Therefore, an appropriate concentration of the developer is chosen to comprise both the fabricating throughput and the pattern resolution. The developing temperature is usually maintained in a range near room temperature when performing the development step.

There are several kinds of development schemes currently being used by IC manufacturing plants. In a normal in-line process, a spray/puddle scheme is utilized to perform the photoresist development. The whole process can be divided into three stages. First, a semiconductor wafer that has been exposed is put on a holder. By using a nozzle, a developer is sprayed onto the surface of the semiconductor wafer. Next, the holder is shaken to help the exposed areas of the photoresist being dissolved by the developer. At the third stage, the holder is rotated to draw out the developer. However, since the developer is not sprayed over the semiconductor wafer uniformly this prior art development scheme generally results in improper pattern transference at the boundary area of the semiconductor wafer. This produces in poor device characteristics. As the diameter of the semiconductor wafer is continuously increased, the problem worsens.

FIG. 1 shows a cross-sectional view of a prior art photoresist development apparatus. As shown in the drawing, a development apparatus primarily consists of a holder for holding a wafer and a nozzle 14 for supplying the developer to the wafer. The holder at least includes a wafer chuck 10 and a vertical spindle 12. When executing the developing process, a semiconductor wafer 20 coated with a photoresist that has been exposed is first held on the wafer chuck 10. By using the nozzle 14, the developer is then sprayed onto the surface of the photoresist to start the developing reaction. Thus, the photoresist pattern 22 is formed on the semiconductor wafer 20.

However, the above-mentioned prior art development apparatus has several drawbacks. First, a certain amount of the developer will run off because there is no obstacle at the boundary area of the semiconductor wafer 20. Therefore, only a limited percent of the sprayed developer will remain on the semiconductor wafer 20 as a result of surface tension, which forms a thin liquid layer 25 for the photoresist developing reaction. Since it is difficult to retain a sufficient amount of the developer on the semiconductor wafer 20, the developer becomes saturated in the middle of the process and then the developing reaction stops. Second, since the developer is supplied by utilizing the nozzle 14 bubbles are easily formed in the liquid layer 25. This will slow down the developing reaction. Furthermore, as the developer remains on the semiconductor wafer 20 because of surface tension, the thickness distribution of the liquid layer 25 is not uniform. The thickness of a portion of liquid layer 25 near the boundary area of the semiconductor wafer 20 (i.e., the dashed line area indicated by a symbol II) is smaller than that of a portion of liquid layer 25 in the central area of the semiconductor wafer 20. Hence, the developing speed of the former is less than that of the latter. This results in the improper pattern transference at the boundary area of the semiconductor wafer 20, such as not completely transferring the pattern to the photoresist or having a line width that is wider than it should be. As the diameter of the semiconductor wafer 20 grows, the problem becomes even worse.

FIG. 2 is a partially magnified view of FIG. 1 especially showing the area indicated by the symbol II. The non-uniformity of distribution of the developer on the semiconductor wafer 20 and the problem of improper pattern transference are now more apparent in FIG. 2. As shown in the drawing, an exemplary photoresist pattern with lines ($t_1$) and spaces ($t_2$) of equal extent is provided. In the central area of the semiconductor wafer 20 (the left portion of FIG. 2), a photoresist pattern 22b is formed with lines and spaces of equal extent, i.e., $t_1=t_2$. But in the area near the boundary of the semiconductor wafer 20 (the right portion of FIG. 2), a photoresist pattern 22a is formed with lines wider than spaces, i.e., $t_1>t_2$ due to inadequate development.

SUMMARY OF THE INVENTION

It is therefore an object of the present invention to provide a modified apparatus for the photoresist development process. The modified apparatus can supply a developer onto the surface of a semiconductor wafer gently and uniformly, thereby improving the developing uniformity and preventing the generation of unwelcome bubbles.

It is another object of the present invention to provide a modified apparatus for the photoresist development process, which includes a container for containing the developer so that a semiconductor wafer can be immersed in the developer for a sufficient development.

The present invention fulfills the above objects by providing a modified apparatus for the photoresist development process of an integrated circuit fabrication, which includes: a holding means which involves a vertical spindle and a chuck fixed on the top of the vertical spindle, for horizontally holding a semiconductor wafer; a liquid feeding means disposed above the holding means, for supplying a developer onto the semiconductor wafer; a cup-type housing means disposed under the holding means, wherein the bottom of the cup-type housing means includes a valve for draining the developer and a hole for allowing the vertical spindle to penetrate through; and a hoisting means fixed on the bottom of the cup-type housing means, so that when the cup-type housing means the edge of the semiconductor wafer is lifted, it tightly contacts the sidewall of the cup-type housing means, thereby forming a dish-like container for containing the developer.

In accordance with the present invention, the apparatus for the photoresist development process of integrated circuit fabrication, is characterized wherein the sidewall of the cup-type housing means includes a tube-shaped lower portion and a divergent upper portion. Furthermore, to support the semiconductor wafer and help forming the dish-like container, a flange is also disposed on the inner part of the divergent upper portion of the cup-type housing means.

In accordance with the present invention, the apparatus for the photoresist development process of an integrated circuit fabrication further includes an ultrasonic system engaged to the cup-type housing means for agitating the developer.

In accordance with the present invention, the apparatus for the photoresist development process of an integrated circuit fabrication further includes a laser end-point detection system engaged to the cup-type housing means.

BRIEF DESCRIPTION OF THE DRAWINGS

Other objects, features and advantages of the present invention will become apparent by way of the following detailed description of the preferred but non-limiting embodiment, with reference to the following drawings.

DETAILED DESCRIPTION OF THE PREFERRED EMBODIMENT

Figure 3:
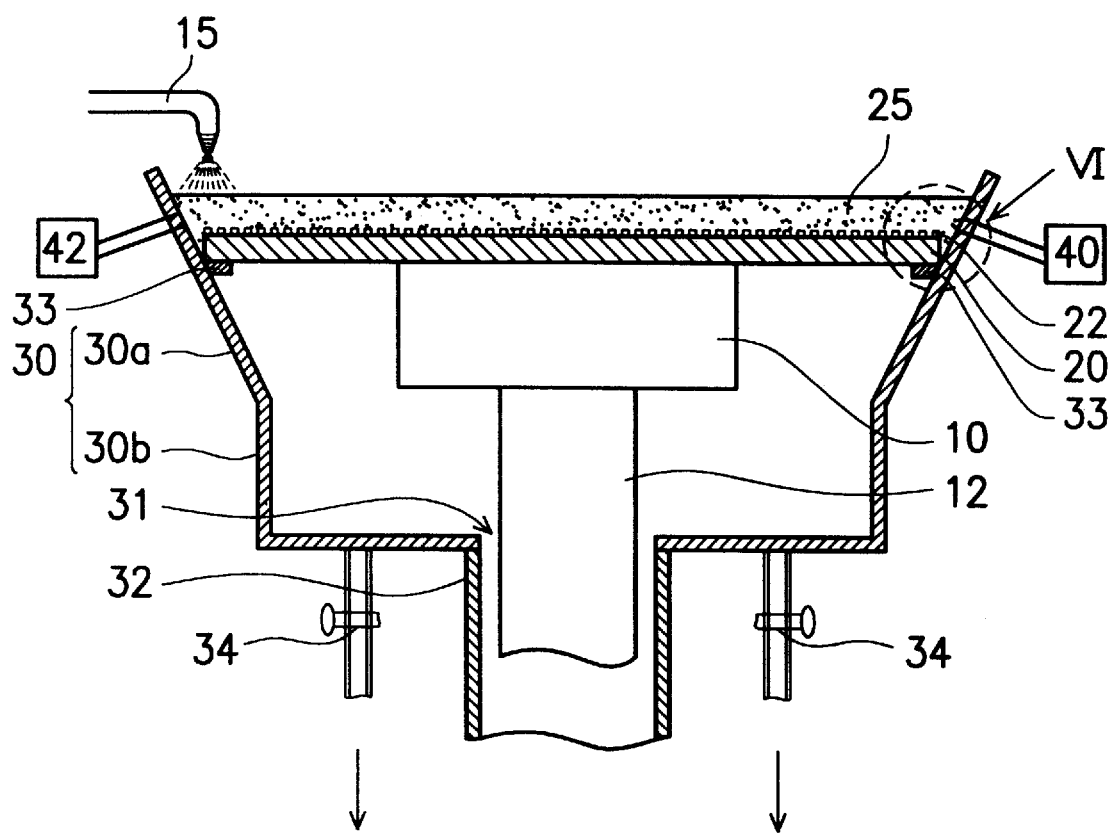
FIG. 3 shows a cross-sectional view of a modified photoresist development apparatus in accordance with a preferred embodiment of the present invention.

FIG. 3 shows a preferred embodiment of a photoresist development apparatus in accordance with of the present invention. The apparatus consists of a holder (10, 12), a liquid feeder 15, a cup-type housing 30, and a hoisting instrument 32. As shown in the drawing, the holder (10, 12) involves a vertical spindle 12 and a wafer chuck 10 fixed on top of the vertical spindle 12, so as to horizontally hold a semiconductor 20 that requires developing. The liquid feeder 15 is disposed above the holder (10, 12), for supplying a developer (i.e., a solution used to dissolve the photoresist) onto the semiconductor wafer 20. On the other side, the cup-type housing 30 is disposed under the holder (10, 12), wherein the bottom of the cup-type housing 30 has a valve 34 for draining the developer after finishing the development process, and a hole 31 for allowing the vertical spindle 12 to penetrate through. In addition, the hoisting instrument 32 is fixed on the bottom of the cup-type housing 30, so as to drive it up and down along the axis of the vertical spindle 12.

The cup-type housing 30 can be a variety of structures. For example, as shown in FIG. 3, the sidewall of the cup-type housing 30 involves a tube-shaped lower portion 30b and a divergent upper portion 30a. However, the cup-type housing 30 is not restricted to this configuration. Any other configuration is acceptable if the sidewall profile can conform to the edge of the semiconductor wafer 20 and then form a container for containing the developer.

When conducting the development process, a semiconductor wafer 20 coated with a layer of photoresist that has been exposed is first held on the wafer chuck 10. The cup-type housing 30 is lifted by the hoisting instrument 32 until the sidewall of the cup-type housing 30 tightly contacts the edge of the semiconductor wafer 20, thereby forming a "dish-like container." By using the liquid feeder 15, a suitable developer 25 is supplied onto the semiconductor wafer 20, until the entire surface of the photoresist is immersed in the developer 25. The photoresist is then developed to form a desired pattern 22. After finishing the developing step, the cup-type housing 30 is dropped by the hoisting instrument 32. Then, the valve 34 is opened to drain the developer 25.

According to the spirit of this invention, additional members can be incorporated to the apparatus. For example, in order to support the semiconductor wafer and help forming the dish-like container, a flange 33 is disposed on the inner part of the divergent upper portion 30a of the cup-type housing 30. Further, an ultrasonic system 40 can be engaged to the cup-type housing 30 for agitating the developer 25. Also, a laser end-point detection system 42 can be engaged to the cup-type housing 30 for performing in-situ detection.

Several advantages can be achieved with this modified developing apparatus. First, as the cup-type housing 30 tightly contacts the edge of the semiconductor wafer 20 to form a dish-like container, all of the developer 25 supplied by the liquid feeder 15 remains on the surface of the photoresist. In addition, the usage of the developer 25 is less than that of the prior art apparatus. Second, because the developer 25 is supplied by using a liquid feeder 15 instead of using a nozzle, the problem of bubbles formed in the developer 25 is eliminated. In addition, as the present apparatus retains more developer on the surface of the photoresist than the prior art apparatus does the uniformity and completion of photoresist developing process can be improved.

Figure 1:
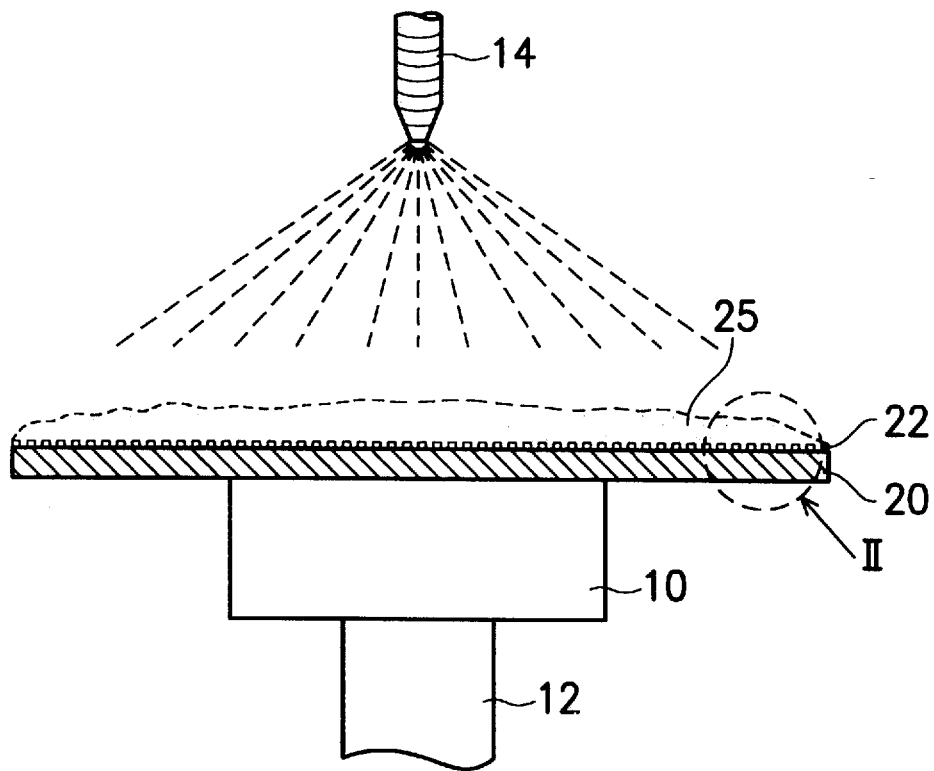
FIG. 1 shows a cross-sectional view of a prior art photoresist development apparatus.
Figure 2:
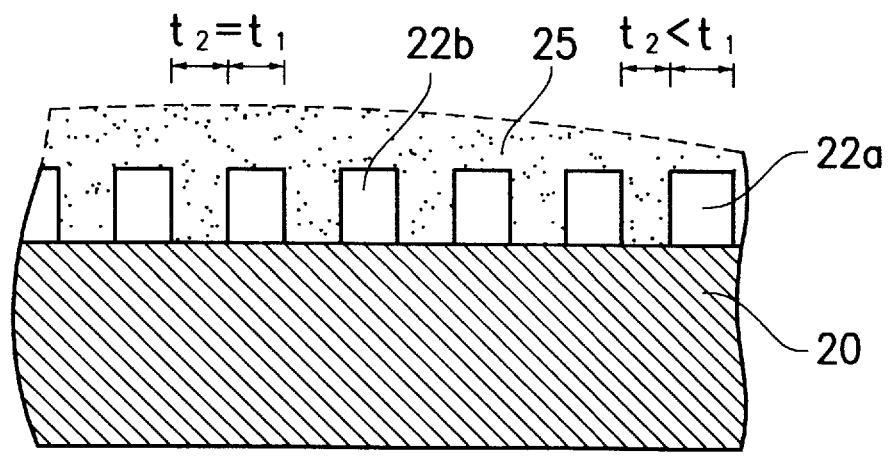
FIG. 2 is a partial magnified view of FIG. 1 especially showing the portion indicated by the symbol II.
Figure 4:
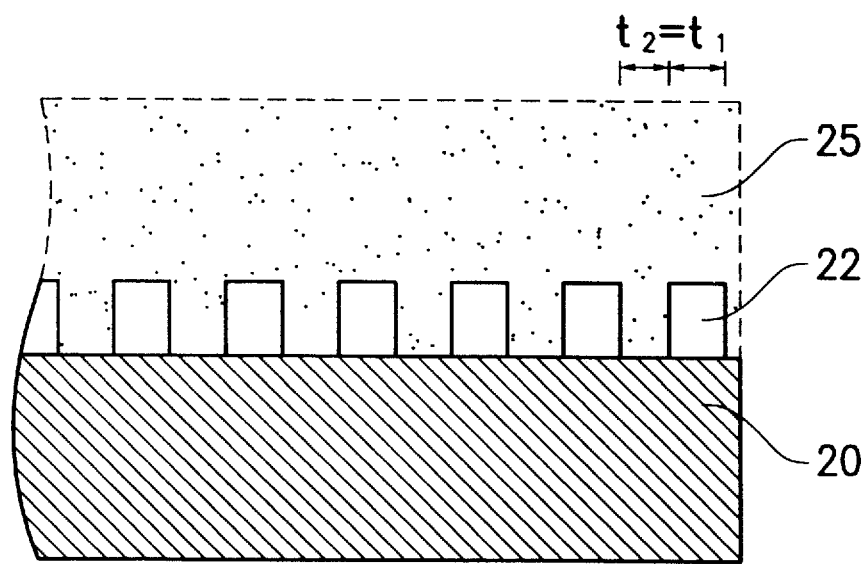
FIG. 4 is a partial magnified view of FIG. 3 especially showing the portion indicated by the symbol IV.

Utilizing the present apparatus solves the problem of improper pattern transference. FIG. 4 is a magnified partial view of FIG. 1, especially showing the area indicated by the symbol IV. As shown in the drawing, a photoresist pattern 22 with lines ($t_1$) and spaces ($t_2$) of equal extent is formed after the development process. The line width of the pattern 22 is kept the same on both the central area of the semiconductor wafer 20 (the left portion of FIG. 4) and the area near the boundary of the semiconductor wafer 20 (the right portion of FIG. 4).

While the invention has been described by way of example and in terms of a preferred embodiment, it is to be understood that the invention is not to be limited thereto. On the contrary, it is intended that the invention cover various modifications and similar arrangements within the spirit and scope of the appended claims, which should be accorded the broadest interpretation so as to encompass all such modifications and similar arrangements.

What is claimed is:

1. An apparatus for the photoresist development process of an integrated circuit fabrication, comprising:

a holding means which includes a vertical spindle and a chuck fixed on the top of said vertical spindle, for horizontally holding a semiconductor wafer;

a liquid feeding means disposed above said holding means, for supplying a developer onto said semiconductor wafer;

a cup-type housing means disposed under said holding means, wherein the bottom of said cup-type housing means includes a valve for draining the developer and a hole for allowing said vertical spindle to penetrate through; and a hoisting means fixed on the bottom of said cup-type housing means, so that when said cup-type housing means is lifted, the edge of said semiconductor wafer tightly contacts the sidewall of said cup-type housing means, forming a dish-like container for containing the developer.

2. The apparatus for the photoresist development process of an integrated circuit fabrication recited in claim 1, wherein the sidewall of said cup-type housing means includes a tube-shaped lower portion and a divergent upper portion.

3. The apparatus for the photoresist development process of an integrated circuit fabrication recited in claim 2, further including a flange disposed on the inner part of said divergent upper portion of said cup-type housing means, for supporting said semiconductor wafer.

4. The apparatus for the photoresist development process of an integrated circuit fabrication recited in claim 1, further comprising an ultrasonic system engaged to said cup-type housing means for agitating the developer.

5. The apparatus for the photoresist development process of an integrated circuit fabrication recited in claim 1, further comprising a laser end-point detection system engaged to said cup-type housing means.

* * * * *